(12) United States Patent
Mori

(10) Patent No.: US 10,110,194 B2
(45) Date of Patent: Oct. 23, 2018

(54) VARIABLE FILTER CIRCUIT, RF FRONT END CIRCUIT AND COMMUNICATION DEVICE

(71) Applicant: Murata Manufacturing Co., Ltd., Kyoto (JP)

(72) Inventor: Hirotsugu Mori, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 15/492,190

(22) Filed: Apr. 20, 2017

(65) Prior Publication Data

US 2017/0288632 A1  Oct. 5, 2017

Related U.S. Application Data

(63) Continuation of application No. PCT/JP2015/079768, filed on Oct. 22, 2015.

(30) Foreign Application Priority Data

Nov. 11, 2014  (JP) .................................. 2014-229085

(51) Int. Cl.
*H04B 1/10* (2006.01)
*H03H 7/12* (2006.01)
(Continued)

(52) U.S. Cl.
CPC ............... *H03H 7/12* (2013.01); *H03H 7/38* (2013.01); *H03F 3/195* (2013.01); *H03F 3/245* (2013.01);
(Continued)

(58) Field of Classification Search
None
See application file for complete search history.

(56) References Cited

U.S. PATENT DOCUMENTS

2005/0099244 A1\* 5/2005 Nakamura ......... H03H 9/02118
333/133
2008/0117000 A1  5/2008 Wada
(Continued)

FOREIGN PATENT DOCUMENTS

JP  2008-131449 A  6/2008
JP  2009-130831 A  6/2009
(Continued)

OTHER PUBLICATIONS

International Search Report for PCT/JP2015/079768 dated Nov. 24, 2015.
Written Opinion for PCT/JP2015/079768 dated Nov. 24, 2015.

*Primary Examiner* — Lana N Le
(74) *Attorney, Agent, or Firm* — Pearne & Gordon LLP

(57) ABSTRACT

Provided is a variable filter circuit that can control the bandwidth and center frequency of a pass band, can realize steep attenuation characteristics in bands close to the pass band, and enables the total number of variable reactance units to be reduced. A variable filter circuit includes an inductor (Ls1) and a capacitor (Cs1), which are connected in series between a first input/output terminal (P1) and a second input/output terminal (P2), and resonators (Re_p1, Re_p2, Re_p3, Re_p4) and variable capacitors (Cc1, Cc2, Cc3, Cc4), which are connected in series between two ends of the inductor (Ls1) and the capacitor (Cs1) and ground connection terminals.

11 Claims, 10 Drawing Sheets

(51) Int. Cl.
*H03H 7/38* (2006.01)
*H03F 3/195* (2006.01)
*H03F 3/24* (2006.01)

(52) U.S. Cl.
CPC .. *H03F 2200/294* (2013.01); *H03F 2200/451* (2013.01)

(56) References Cited

U.S. PATENT DOCUMENTS

| | | | |
|---|---|---|---|
| 2009/0315643 A1 | 12/2009 | Yamakawa et al. | |
| 2011/0090026 A1* | 4/2011 | Nakahashi | H03H 9/14594 333/195 |
| 2011/0280571 A1* | 11/2011 | Hsia | H04B 10/675 398/45 |
| 2014/0106698 A1* | 4/2014 | Mi | H03H 7/0123 455/307 |
| 2014/0113580 A1* | 4/2014 | Yamazaki | H03H 9/6483 455/307 |
| 2015/0091669 A1* | 4/2015 | Mizoguchi | H03H 7/1766 333/132 |
| 2016/0344370 A1* | 11/2016 | Tani | H03H 7/0161 |
| 2016/0352310 A1* | 12/2016 | Tani | H03H 9/64 |
| 2017/0194939 A1* | 7/2017 | Mukai | H03H 9/64 |
| 2017/0272055 A1* | 9/2017 | Nakahori | H03H 7/0153 |

FOREIGN PATENT DOCUMENTS

| | | |
|---|---|---|
| WO | 2008/062753 A1 | 5/2008 |
| WO | 2013/005264 A1 | 1/2013 |

* cited by examiner

VARIABLE FILTER CIRCUIT, RF FRONT END CIRCUIT AND COMMUNICATION DEVICE

This application is a continuation of International Application No. PCT/JP2015/079768 filed on Oct. 22, 2015 which claims priority from Japanese Patent Application No. 2014-229085 filed on Nov. 11, 2014. The contents of these applications are incorporated herein by reference in their entireties.

BACKGROUND

Technical Field

The present disclosure relates to a variable filter circuit that has a variable bandpass characteristic, to an RF front end circuit that uses the variable filter circuit, and to a communication device that uses the RF front end circuit.

In the related art, a band-pass-filter-type variable filter circuit has been proposed (for example, refer to Patent Document 1). The variable filter circuit of the related art has a ladder configuration in which a plurality of resonators is connected in parallel and series in an alternating manner. Two variable capacitors are connected in parallel and series with each resonator, and the frequency and the bandwidth of the pass band can be controlled by adjusting the variable capacitors.

Patent Document 1: Japanese Unexamined Patent Application Publication No. 2009-130831

BRIEF SUMMARY

In the variable filter circuit of the related art, it is difficult to adjust the attenuation characteristic so as to be steep at frequencies close to the high-frequency side of the pass band and the low-frequency side of the pass band using the variable capacitors. Consequently, in the case where the communication band of a certain communication signal to which the variable filter circuit is to be applied is adjacent to the communication band of another communication signal, even when the pass band of the variable filter circuit is made to match the desired communication band, it may not be possible to secure the required attenuation characteristic in the other communication band that is adjacent to the desired communication band.

Furthermore, in the variable filter circuit of the related art, since the frequency and bandwidth of the pass band are made variable by connecting two variable capacitors to each resonator, 2×n variable capacitors are needed when n resonators are provided, and the total number of variable capacitors is liable to become large. Therefore, an increase in the size of the circuit and an increase in the complexity of controlling the variable capacitors are incurred due to the variable capacitors.

Accordingly, the present disclosure provides a variable filter circuit, an RF front end circuit and a communication device in which the frequency and bandwidth of a pass band can be varied even through the total number of variable capacitors has been reduced, and in which a steep attenuation characteristic can be easily realized at frequencies close to the high-frequency side and the low-frequency side of the pass band.

A variable filter circuit of the present disclosure includes: a plurality of reactance elements that are connected in series between a first input/output terminal and a second input/output terminal; a plurality of resonance units that have resonance characteristics and are connected between two ends of the plurality of reactance elements and ground connection terminals; and variable reactance units that have variable reactances and are connected in series with the resonance units between ends of the reactance elements and the ground connection terminals. The plurality of reactance elements includes a capacitive element that functions as a capacitive reactance in a prescribed band and an inductive element that functions as an inductive reactance in a prescribed band.

With this configuration, a high pass filter can be formed by a π circuit composed of the capacitive element and the resonance units connected to the two ends of the capacitive element. In the π circuit, a steep attenuation characteristic can be obtained in a band close to the low-frequency side of a pass band of the variable filter circuit by appropriately adjusting the reactance of the capacitive element. In addition, in the case where variable reactance units are included in the π circuit, the low-frequency-side cutoff frequency of the pass band can be adjusted by controlling the variable reactance units. In addition, a low pass filter can be formed by a π circuit composed of the inductive element and the resonance units connected to the ends of the inductive element. In the π circuit, a steep attenuation characteristic can be obtained in a band close to the high-frequency side of the pass band of the variable filter circuit by appropriately adjusting the reactance of the inductive element. In addition, in the case where variable reactance units are included in the π circuit, the high-frequency-side cutoff frequency of the pass band can be adjusted by controlling the variable reactance units. Thus, the bandwidth and the center frequency of the pass band of the variable filter circuit can be controlled while obtaining a steep attenuation characteristic in bands close to the high-frequency side and the low-frequency side of the pass band. The total number of variable reactance units can be reduced to be the same as the number of resonance units at most, and increases in the circuit size and the complexity of the control system can be suppressed.

The variable filter circuit according to the present disclosure can further include inductors that are connected in series or parallel with the resonance units. The frequency interval between a resonance point and an anti-resonance point in the impedance characteristic can be widened by connecting inductors to the resonance units in this manner. Thus, the ranges over which the cutoff frequencies can be varied by controlling the variable reactance units can be increased.

In the variable filter circuit according to the present disclosure, the resonance units may each include a plurality of resonators and a resonator selecting unit that selects and connects any one of the plurality of resonators. In this case, the variable filter circuit can be made to support a plurality of communication bands by allowing each resonator to support a different communication band. A variable reactance unit can be shared by a plurality of resonators by providing the resonator selecting unit. Therefore, the total number of variable reactance units can be reduced and increases in the circuit size and the complexity of controlling the variable reactance units can be suppressed.

The variable filter circuit according to the present disclosure can further include a matching network that is connected between the inductive element and the capacitive element.

With this configuration, matching can be achieved between the low pass filter and the high pass filter over a very wide frequency band.

The variable filter circuit according to the present disclosure may further include reactance units that are connected in parallel with the resonance units, and connection switching units that switch connection states of the reactance units.

With this configuration, the frequency characteristics can be further changed by switching the connection switching units.

An RF front end circuit according to the present disclosure can include the filter circuit described above; an antenna connection terminal that is provided on one side of the filter circuit; and a signal processing circuit connection terminal that is provided on another side of the filter circuit.

A communication device according to the present disclosure can include the RF front end circuit described above; an antenna that is connected to the antenna connection terminal; and a signal processing circuit that is connected to the signal processing circuit connection terminal.

According to the present disclosure, a band pass filter can be formed by combining a high pass filter that includes a capacitive element and a low pass filter that includes an inductive element. By controlling variable reactance units, steep attenuation characteristics can be obtained in bands close to the low-frequency side and the high-frequency side of the pass band, and the bandwidth and the center frequency of the pass band can be controlled. The total number of variable reactance units can be reduced to be about the same as the number of resonance units, and increases in the circuit size and the complexity of the control system can be suppressed.

DETAILED DESCRIPTION

Figure 1:
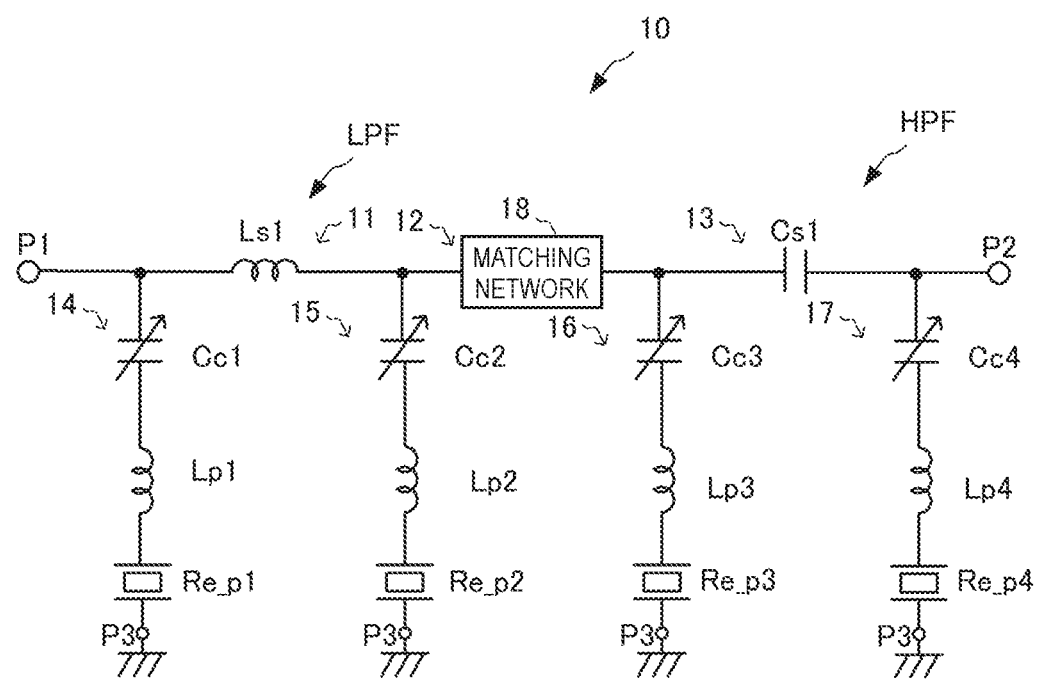
FIG. 1 is a circuit diagram of a variable filter circuit according to a first embodiment.

Hereafter, a plurality of modes for carrying the present disclosure will be described by giving a number of specific examples while referring to the drawings. Like symbols denote like parts in the drawings. Each embodiment is an illustrative example and it goes without necessarily saying that parts of the configurations illustrated in different embodiments can be substituted for one another or combined with each other.

<<First Embodiment>>

FIG. 1 is a circuit diagram that illustrates a variable filter circuit 10 according to a first embodiment of the present disclosure.

The variable filter circuit 10 includes ports P1, P2 and P3, series arms 11, 12 and 13, and parallel arms 14, 15, 16 and 17.

The port P1 is a first input/output terminal of the variable filter circuit 10. The port P2 is a second input/output terminal of the variable filter circuit 10. The ports P3 are ground connection terminals of the variable filter circuit 10.

One end of the series arm 11 is connected to the port P1 and the other end of the series arm 11 is connected to the series arm 12. One end of the series arm 12 is connected to the series arm 11 and the other end of the series arm 12 is connected to the series arm 13. One end of the series arm 13 is connected to the series arm 12 and the other end of the series arm 13 is connected to the port P2. In other words, the series arm 11, the series arm 12 and the series arm 13 are connected in series between the port P1 and the port P2.

One end of the parallel arm 14 is connected to a connection point between the port P1 and the series arm 11, and the other end of the parallel arm 14 is connected to a port P3. One end of the parallel arm 15 is connected to a connection point between the series arm 11 and the series arm 12, and the other end of the parallel arm 15 is connected to a port P3. One end of the parallel arm 16 is connected to a connection point between the series arm 12 and the series arm 13, and the other end of the parallel arm 16 is connected to a port P3. One end of the parallel arm 17 is connected to a connection point between the series arm 13 and the port P2, and the other end of the parallel arm 17 is connected to a port P3.

Thus, the series arm 11 and the parallel arms 14 and 15 form a first π circuit LPF. In addition, the series arm 13 and the parallel arms 16 and 17 form a second π circuit HPF.

The series arm 11 includes an inductor Ls1. The inductor Ls1 corresponds to an inductive element described in the Claims. The series arm 12 includes a matching network 18. The matching network 18 matches the impedances between the first π circuit LPF and the second π circuit HPF. The series arm 13 includes a capacitor Cs1. The capacitor Cs1 corresponds to a capacitive element described in the Claims. The inductor Ls1, the matching network 18 and the capacitor Cs1 are connected in series between the port P1 and the port P2.

Another circuit or element may be used as the inductive element so long as the circuit or element exhibits inductive reactance in a set pass band. For example, a resonator has an inductive reactance in a frequency band between a resonance point and an anti-resonance point of the resonator, and therefore, a resonator may be used that has frequency characteristics in which the set pass band corresponds to the frequency band between the resonance point and the anti-resonance point of the resonator. In addition, another circuit or element may be used as the capacitive element so long as the circuit or element exhibits capacitive reactance in the set pass band. For example, a resonator has an capacitive reactance in a frequency band spaced apart from a frequency band between a resonance point and an anti-resonance point of the resonator, and therefore, a resonator may be used that has frequency characteristics in which the set pass band is spaced apart from the frequency band between the resonance point and the anti-resonance point of the resonator.

The parallel arm 14 includes a resonator Re_p1, an inductor Lp1 and a variable capacitor Cc1. One end of the variable capacitor Cc1 is connected to a connection point between the port P1 and the inductor Ls1, and the other end of the variable capacitor Cc1 is connected to the inductor Lp1. One end of the inductor Lp1 is connected to the variable capacitor Cc1 and the other end of the inductor Lp1 is connected to the resonator Re_p1. One end of the resonator Re_p1 is connected to the inductor Lp1 and the other end of the resonator Re_p1 is connected to the port P3. In other words, the resonator Re_p1, the inductor Lp1 and the variable capacitor Cc1 are connected in series between one end of the inductor Ls1 and the port P3.

The parallel arm 15 includes a resonator Re_p2, an inductor Lp2 and a variable capacitor Cc2. One end of the variable capacitor Cc2 is connected to a connection point between the inductor Ls1 and the matching network 18, and the other end of the variable capacitor Cc2 is connected to the inductor Lp2. One end of the inductor Lp2 is connected to the variable capacitor Cc2 and the other end of the inductor Lp2 is connected to the resonator Re_p2. One end of the resonator Re_p2 is connected to the inductor Lp2 and the other end of the resonator Re_p2 is connected to the port P3. In other words, the resonator Re_p2, the inductor Lp2 and the variable capacitor Cc2 are connected in series between the other end of the inductor Ls1 and the port P3.

The parallel arm 16 includes a resonator Re_p3, an inductor Lp3 and a variable capacitor Cc3. One end of the variable capacitor Cc3 is connected to a connection point between the matching network 18 and the capacitor Cs1, and the other end of the variable capacitor Cc3 is connected to the inductor Lp3. One end of the inductor Lp3 is connected to the variable capacitor Cc3 and the other end of the inductor Lp3 is connected to the resonator Re_p3. One end of the resonator Re_p3 is connected to the inductor Lp3 and the other end of the resonator Re_p3 is connected to the port P3. In other words, the resonator Re_p3, the inductor Lp3 and the variable capacitor Cc3 are connected in series between one end of the capacitor Cs1 and the port P3.

The parallel arm 17 includes a resonator Re_p4, an inductor Lp4 and a variable capacitor Cc4. One end of the variable capacitor Cc4 is connected to a connection point between the capacitor Cs1 and the port P2, and the other end of the variable capacitor Cc4 is connected to the inductor Lp4. One end of the inductor Lp4 is connected to the variable capacitor Cc4 and the other end of the inductor Lp4 is connected to the resonator Re_p4. One end of the resonator Re_p4 is connected to the inductor Lp4 and the other end of the resonator Re_p4 is connected to the port P3. In other words, the resonator Re_p4, the inductor Lp4 and the variable capacitor Cc4 are connected in series between the other end of the capacitor Cs1 and the port P3.

The resonators Re_p1, Re_p2, Re_p3 and Re_p4 provided in the parallel arms 14, 15, 16, and 17, respectively, each correspond to a resonance unit described in the Claims. For example, a piezoelectric resonator such as a SAW resonator or a BAW resonator, a dielectric coaxial resonator or an LC resonance circuit can be used as the resonance units. Furthermore, the variable capacitors Cc1, Cc2, Cc3 and Cc4 provided in the parallel arms 14, 15, 16, and 17, respectively, each correspond to a variable reactance unit described in the Claims. A circuit or element having a variable inductance can be used as the variable reactance units. In addition, the elements used as the inductor Ls1, the capacitor Cs1 and the inductor Lp1, Lp2, Lp3 and Lp4 and the characteristics thereof can be appropriately chosen in accordance with the bandpass characteristic required in the variable filter circuit 10.

Next, an outline of the functions of the series arm reactance elements (capacitor Cs1 and inductor Ls1) in the first π circuit LPF and the second π circuit HPF will be described. In the following description, it is assumed that the resonator Re_p1 and the resonator Re_p2 have the same resonance characteristics and that the resonator Re_p3 and the resonator Re_p4 have the same resonance characteristics.

Figure 2A:
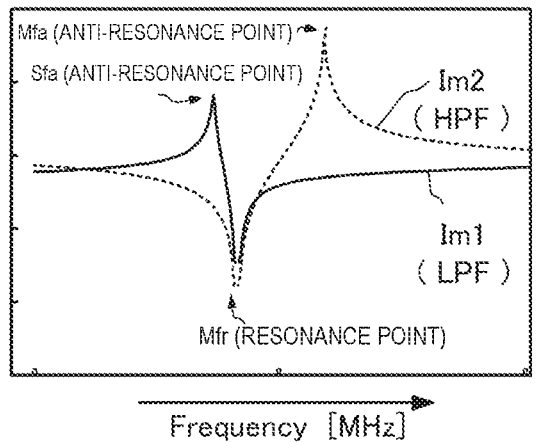
FIGS. 2A-2C are characteristics diagrams for explaining the function of reactance elements of series arms according to the first embodiment.

FIG. 2A illustrates impedance characteristics in a circuit in which a resonator and a reactance element are connected to each other. The solid line in FIG. 2A illustrates an impedance characteristic Im1 in a circuit in which the inductor Ls1 and the resonator Re_p1 or the resonator Re_p2 are connected to each other. In addition, the dotted line in FIG. 2A illustrates an impedance characteristic Im2 in a circuit in which the capacitor Cs1 and the resonator Re_p3 or the resonator Re_p4 are connected to each other.

When the inductor Ls1 is connected to a resonator, the inductor Ls1 is appropriately adjusted, and as a result, an anti-resonance point Sfa can be generated on the low-frequency side of a resonance point Mfr as in the impedance characteristic Im1. On the other hand, when the capacitor Cs1 is connected to a resonator, the capacitor Cs1 is appropriately adjusted, and as a result, an anti-resonance point Mfa can be generated on the high-frequency side of the resonance point Mfr as in the impedance characteristic Im2.

Figure 2B:
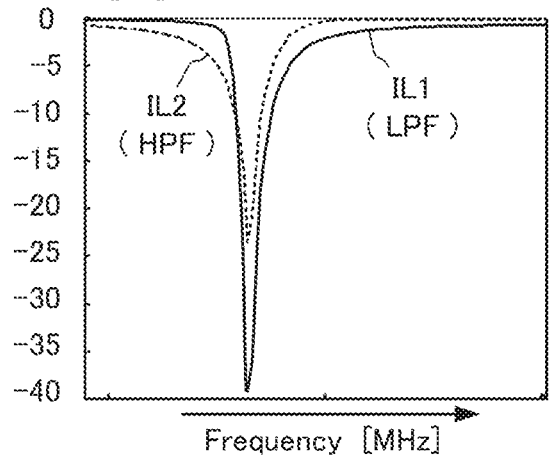

FIG. 2B illustrates the bandpass characteristics of the first π circuit LPF and the second π circuit HPF when the variable capacitors Cc1, Cc2, Cc3 and Cc4 and the inductors Lp1, Lp2, Lp3 and Lp4 are omitted. The solid line in FIG. 2B illustrates a bandpass characteristic IL1 in the first π circuit LPF. In addition, the dotted line in FIG. 2B illustrates a bandpass characteristic IL2 in the second π circuit HPF.

The bandpass characteristic IL1 of the first π circuit LPF is a characteristic that has a pass band and an attenuation pole on the high-frequency side of the pass band, and in which the attenuation from the pass band toward the attenuation pole on the high-frequency side is steep (low pass type). On the other hand, the bandpass characteristic IL2 of the second π circuit HPF is a characteristic that has a pass band and an attenuation pole on the low-frequency side of the pass band, and in which the attenuation from the pass band toward the attenuation pole on the low-frequency side is steep (high pass type).

Figure 2C:
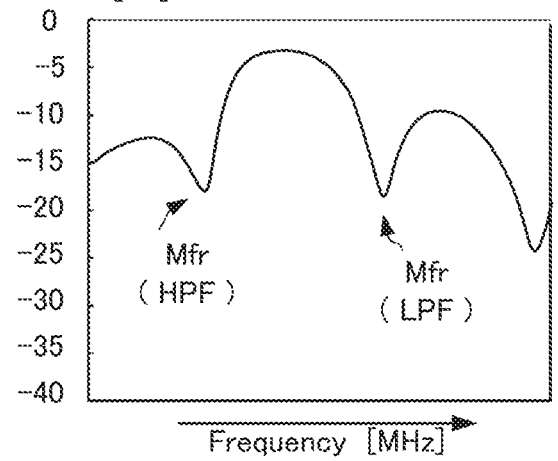

Thus, the bandpass characteristics of the π circuits can be set as a high pass characteristic or a low pass characteristic depending on whether the reactance element provided in the series arm 11 or 12 is a reactance element having a capacitive reactance or is a reactance element having an inductive reactance. Therefore, a bandpass-type bandpass characteristic can be obtained overall in the variable filter circuit 10 by setting the attenuation pole of the high-pass-type second π circuit HPF at a frequency that is lower than the attenuation pole of the low-pass-type first π circuit LPF. FIG. 2C illustrates an example of the bandpass characteristic of the variable filter circuit 10 in which a bandpass-type characteristic is realized by setting the resonance point Mfr of the high-pass-type second π circuit HPF to a frequency that is lower than the resonance point Mfr of the low-pass-type first π circuit LPF.

Next, an outline of the functions of the inductors Lp1, Lp2, Lp3 and Lp4 of the first π circuit LPF and the second π circuit HPF will be described.

Figure 3:
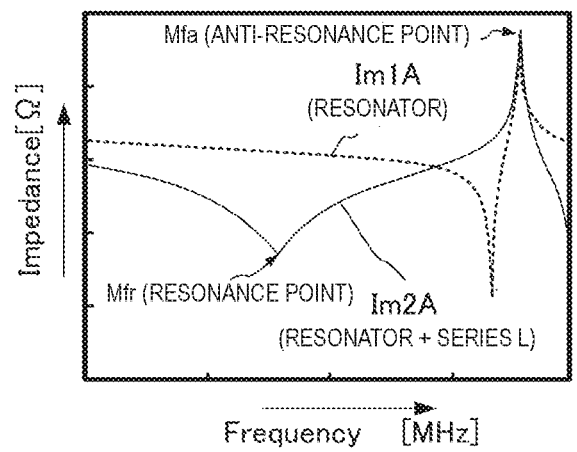
FIG. 3 is a characteristics diagram for explaining the function of reactance elements of parallel arms according to the first embodiment.

FIG. 3 illustrates impedance characteristics in a circuit in which the inductor Lp1 and the resonator Re_p1 are connected to each other. The dotted line in FIG. 3 represents an impedance characteristic Im1A of just the resonator Re_p1. In addition, the solid line in FIG. 3 represents an impedance characteristic Im2A in a circuit in which the inductor Lp1 and the resonator Re_p1 are connected to each other.

Comparing the impedance characteristic Im2A of the resonator Re_p1 in the case where the inductor Lp1 is provided and the impedance characteristic Im1A of the resonator Re_p1 in the case where the inductor Lp1 is omitted illustrated in FIG. 3, although the anti-resonance points Mfa are the same, the resonance point Mfr of the impedance characteristic Im2A is shifted toward the low-frequency side compared with the resonance point Mfr of the impedance characteristic Im1A.

Thus, the inductor Lp1 has a function of widening the frequency interval between the resonance point Mfr and the anti-resonance point Mfa by causing the resonance point Mfr of the resonator Re_p1 to shift toward the low-frequency side in the impedance characteristic. Similarly, the inductors Lp2, Lp3 and Lp4 have functions of widening the frequency interval between the resonance point Mfr and the anti-resonance point Mfa by causing the resonance points Mfr of the resonators Re_p2, Re_p3 and Re_p4 to shift toward the low-frequency side in the impedance characteristics.

Next, an outline of the functions of the variable capacitors Cc1, Cc2, Cc3 and Cc4 of the first π circuit LPF and the second π circuit HPF will be described.

Figure 4A:
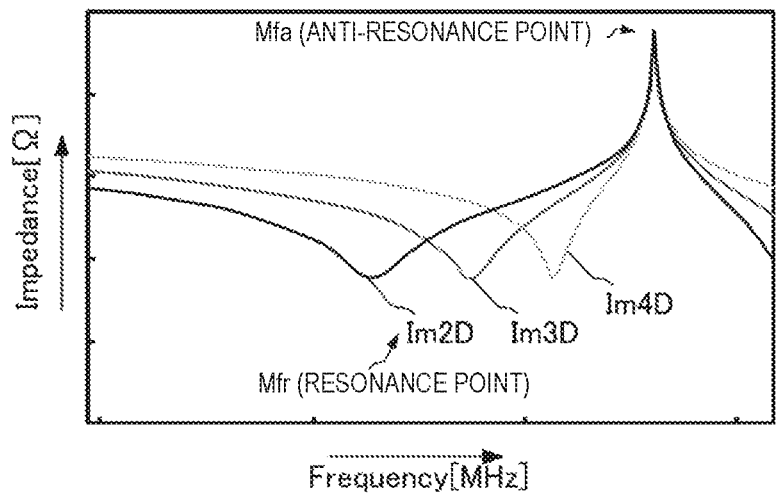
FIGS. 4A-4C are characteristics diagrams for explaining the function of variable capacitors according to the first embodiment.

FIG. 4A illustrates impedance characteristics in a circuit in which the variable capacitor Cc1, the inductor Lp1 and the resonator Re_p1 are connected to each other. In impedance characteristics Im2D, Im3D and Im4D represented by the solid lines in FIG. 4A, the capacitance of the variable capacitor Cc1 is set so as to become smaller in the order Im2D, Im3D, Im4D.

In the impedance characteristics Im2D, Im3D and Im4D, the frequencies of the anti-resonance points Mfa are the same, but the frequency of the resonance point Mfr moves closer to the anti-resonance point Mfa and is positioned further toward the high-frequency side as the capacitance of the variable capacitor Cc1 becomes smaller.

Figure 4B:
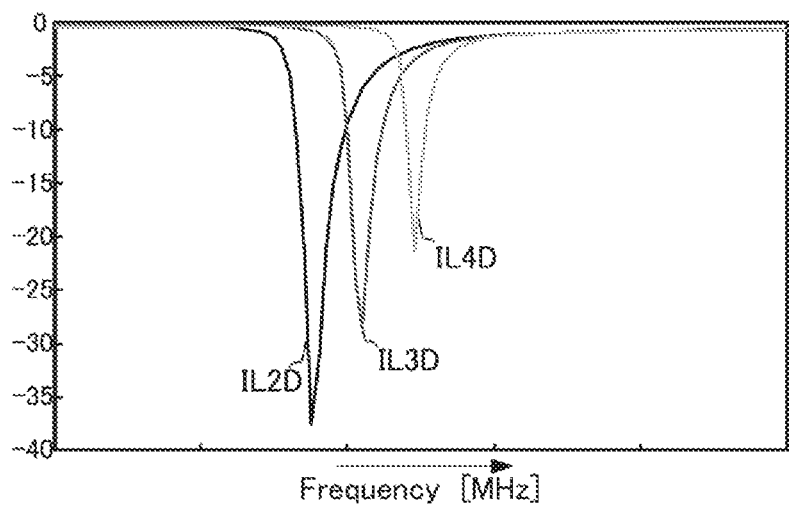

FIG. 4B is a bandpass characteristic diagram of the first π circuit LPF. In bandpass characteristics IL2D, IL3D and IL4D represented by the solid lines in FIG. 4B, the capacitances of the variable capacitors Cc1 and Cc2 are set so as to become smaller in the order IL2D, IL3D, IL4D. In the bandpass characteristics IL2D, IL3D and IL4D, a cutoff frequency on the high-frequency side of the pass band is shifted toward the high-frequency side as the capacitances of the variable capacitors Cc1 and Cc2 become smaller.

However, even if control is performed to make the capacitances of the variable capacitors Cc1 and Cc2 very small, the cutoff frequency of the first π circuit LPF cannot be adjusted beyond a prescribed frequency on the high-frequency side. This is because the frequency of the resonance point Mfr cannot be adjusted beyond the frequency of the anti-resonance point Mfa on the high-frequency side in the impedance characteristic, and the variable range of the cutoff frequency of the pass band is restricted to the band between the resonance point Mfr and the anti-resonance point Mfa in the case where the variable capacitors Cc1 and Cc2 are not provided. Therefore, as illustrated in FIG. 3, the variable range of the cutoff frequency of the pass band can be widened by widening the band between the resonance point Mfr and the anti-resonance point Mfa by connecting the inductors Lp1 and Lp2 in series with the resonators Re_p1 and Re_p2.

As described above, in the first π circuit LPF, the variable capacitors Cc1 and Cc2 have functions of shifting the resonance points Mfr of the resonators Re_p1 and Re_p2 and the high-frequency-side cutoff frequency of the pass band further toward the high-frequency side. The above-described changes in impedance characteristics and bandpass characteristics are similarly generated in the second π circuit HPF. In other words, in the second π circuit HPF, the low-frequency side cutoff frequency of the pass band is shifted toward the high-frequency side as the capacitances of the variable capacitors Cc3 and Cc4 become smaller, and the variable capacitors Cc3 and Cc4 of the second π circuit HPF have functions of shifting the resonance points Mfr of the resonators Re_p3 and Re_p4 and the low-frequency side cutoff frequency of the pass band toward the high-frequency side.

Figure 4C:
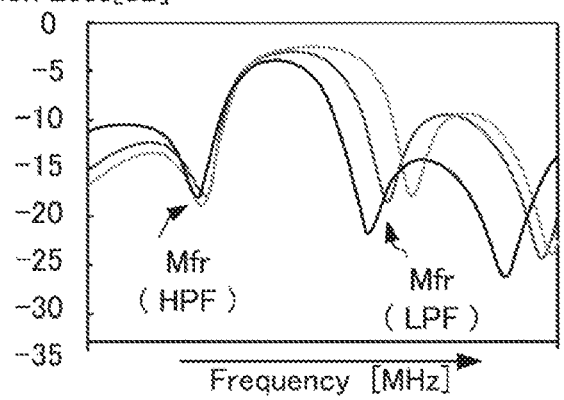

Therefore, in the case where a bandpass-type bandpass characteristic is obtained across the entire variable filter circuit 10, the high-frequency-side cutoff frequency of the pass band can be controlled by adjusting the variable capacitors Cc1 and Cc2, and the low-frequency side cutoff frequency of the pass band can be controlled by adjusting the variable capacitors Cc3 and Cc4. FIG. 4C illustrates an example of changes that occur in the bandpass characteristic when the high-frequency-side cutoff frequency of the pass band is controlled by adjusting the variable capacitors Cc1 and Cc2. As illustrated in FIG. 4C, the high-frequency-side cutoff frequency of the pass band can be controlled by adjusting the variable capacitors Cc1 and Cc2, and as a result, the bandwidth and the center frequency of the pass band can be controlled. In addition, similarly, in the case where the low-frequency-side cutoff frequency of the pass band is controlled by adjusting the variable capacitors Cc3 and Cc4, the bandwidth and the center frequency of the pass band can be controlled by controlling the low-frequency-side cutoff frequency of the pass band.

As described above, in the variable filter circuit 10 according to this embodiment, the high-frequency-side and low-frequency-side cutoff frequencies of the pass band and the bandwidth and the center frequency of the pass band can be controlled by controlling the variable capacitors Cc1, Cc2, Cc3 and Cc4. In addition, it is possible to increase the steepness of the attenuation characteristics in bands close to the low-frequency side and the high-frequency side of the pass band compared with the configuration of the related art by providing the capacitor Cs1 and the inductor Ls1. In addition, the low-frequency-side and high-frequency-side cutoff frequencies of the pass band can be adjusted by controlling the variable capacitors Cc1, Cc2, Cc3 and Cc4 in a state where the variable range of the cutoff frequencies has been widened by providing the inductors Lp1, Lp2, Lp3 and Lp4.

Even when the variable filter circuit is configured such the bandpass characteristic thereof can be freely controlled in this way, it is sufficient that one variable capacitor be provided for the same number of resonators in each of the parallel arms 14, 15, 16 and 17, and thus the total number of variable capacitors can be suppressed. Therefore, an increase in the overall size of the variable filter circuit 10 and an increase in the complexity of controlling the variable capacitors can be suppressed.

Although an example has been described in this embodiment in which variable capacitors are provided in both the first π circuit LPF and the second π circuit HPF, a configuration may instead be adopted in which variable capacitors are only provided in one of the π circuits. In addition, although an example has been described in which two variable capacitors are provided for the parallel arms in each π circuit, a configuration may instead be adopted in which a variable capacitor is provided just one of the parallel arms. Furthermore, although an example has been described in which one inductor is connected in series with each resonator, a configuration may instead be adopted in which an inductor is only connected to some of the resonators rather than all of the resonators or in which no inductors are connected to any of the resonators. In addition, a matching network does not necessarily have to be provided when matching can be secured even when the π circuits are directly connected to each other.

<<Second Embodiment>>

Figure 5:
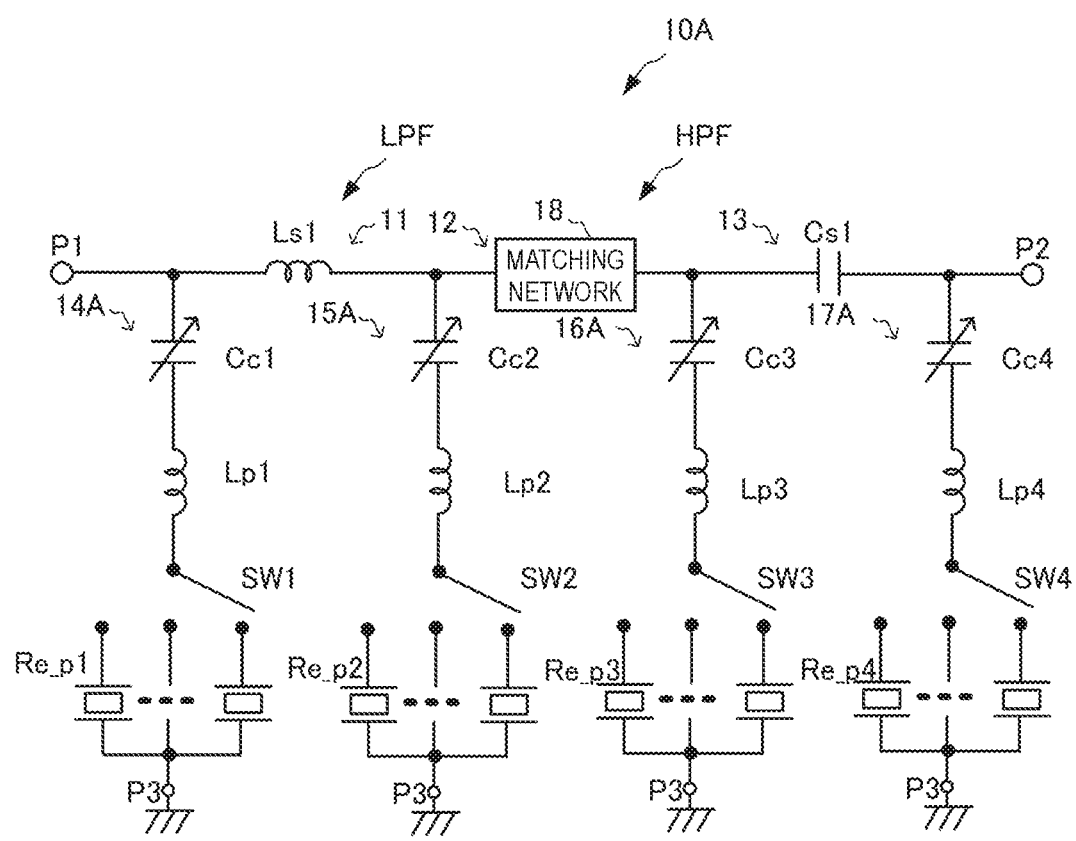
FIG. 5 is a circuit diagram of a variable filter circuit according to a second embodiment.

FIG. 5 is a circuit diagram that illustrates a variable filter circuit 10A according to a second embodiment of the present disclosure. In the following description, a case in which the variable filter circuit 10A is applied to a communication band divided into a plurality of narrow band channels will be described as an example.

The variable filter circuit 10A includes ports P1, P2 and P3, series arms 11, 12 and 13, and parallel arms 14A, 15A, 16A and 17A.

The parallel arm 14A includes a variable capacitor Cc1, an inductor Lp1, a switch SW1 and a plurality of resonators Re_p1. The switch SW1 has a function of selecting and connecting any one of the plurality of resonators Re_p1 to the parallel arm 14A. The parallel arm 15A includes a variable capacitor Cc2, an inductor Lp2, a switch SW2 and a plurality of resonators Re_p2. The switch SW2 has a function of selecting and connecting any one of the plurality of resonators Re_p2 to the parallel arm 15A. The resonance points Mfr of plurality of resonators Re_p1 and the plurality of resonator Re_p2 are respectively assigned to bands that are close to the high-frequency sides of the plurality of communication bands, which are partitioned from one another from the low-frequency side to the high-frequency side.

In addition, the parallel arm 16A includes a variable capacitor Cc3, an inductor Lp3, a switch SW3 and a plurality of resonators Re_p3. The switch SW3 has a function of selecting and connecting any one of the plurality of resonators Re_p3 to the parallel arm 16A. The parallel arm 17A includes a variable capacitor Cc4, an inductor Lp4, a switch SW4 and a plurality of resonators Re_p4. The switch SW4 has a function of selecting and connecting any one of the plurality of resonators Re_p4 to the parallel arm 17A. The resonance points Mfr of plurality of resonators Re_p3 and the plurality of resonator Re_p4 are respectively assigned to bands that are close to the low-frequency sides of the plurality of communication bands, which are partitioned from one another from the low-frequency side to the high-frequency side.

The switches SW1, SW2, SW3 and SW4 correspond to a resonator selecting unit described in the Claims.

Figure 6A:
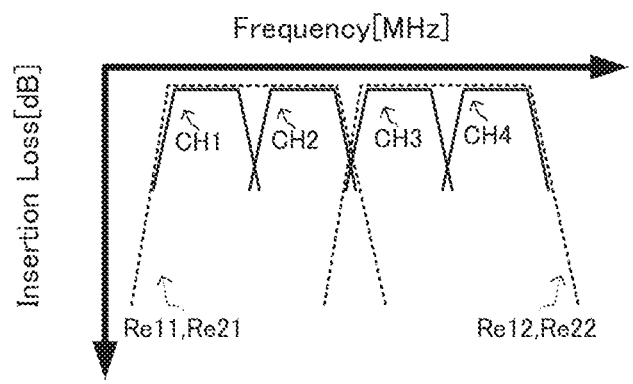
FIGS. 6A and 6B are characteristics diagrams for explaining the function of switches according to the second embodiment.

FIG. 6A is a conceptual diagram for describing the functions of the switches SW1 and SW2 of the variable filter circuit 10A.

In the following description, in the first π circuit LPF, it is assumed that the plurality of resonators Re_p1 and Re_p2, the connections to which are switched by the switches SW1 and SW2, each include resonators Re11 and Re 12, which have different resonance characteristics from each other. In addition, in the second π circuit HPF, it is assumed that the plurality of resonators Re_p3 and Re_p4, the connections to which are switched by the switches SW3 and SW4, each include resonators Re21 and Re 22, which have different resonance characteristics from each other. Furthermore, it is assumed that communication bands supported by the variable filter circuit 10A include channels CH1, CH2, CH3 and CH4. The channels CH1, CH2, CH3 and CH4 are close to each other and are partitioned into communication bands from the low-frequency side to the high-frequency side in the order CH1, CH2, CH3, CH4.

When the variable filter circuit 10A is controlled such that only the channel CH1 is set as the pass band, the resonators Re11 are selected by the switches SW1 and SW2 and are connected to the variable capacitors Cc1 and Cc2. The high-frequency-side cutoff frequency of the variable filter circuit 10A is made to match a prescribed boundary frequency on the high-frequency side of the channel CH1 by adjusting the variable capacitors Cc1 and Cc2. In addition, the resonators Re21 are selected by the switches SW3 and SW4 and connected to the variable capacitors Cc3 and Cc4. The low-frequency-side cutoff frequency of the variable filter circuit 10A is made to match a prescribed boundary frequency on the low-frequency side of the channel CH1 by adjusting the variable capacitors Cc3 and Cc4. Thus, only the channel CH1 is set as the pass band of the variable filter circuit 10A.

The resonators Re11 are selected by the switches SW1 and SW2 and the resonators Re21 are selected by the switches SW3 and SW4 when the variable filter circuit 10A is controlled such that only the channel CH2 is set as the pass band thereof, similarly to as in the case where the channel CH1 is set as the pass band. The pass band of the variable filter circuit 10A is made to match the channel CH2 by adjusting the variable capacitors Cc1 and Cc2 and the variable capacitors Cc3 and Cc4.

In addition, when the variable filter circuit 10A is controlled such that only the channel CH3 is set as the pass band thereof, the resonators Re12 are selected by the switches SW1 and SW2 and the high-frequency-side cutoff frequency of the variable filter circuit 10A is made to match the high-frequency-side boundary frequency of the channel CH3 by adjusting the variable capacitors Cc1 and Cc2. In addition, the resonators Re22 are selected by the switches SW3 and SW4 and the low-frequency-side cutoff frequency of the variable filter circuit 10A is made to match the low-frequency-side boundary frequency of the channel CH3 by adjusting the variable capacitors Cc3 and Cc4. Thus, only the channel CH3 is set as the pass band of the variable filter circuit 10A.

The resonators Re12 are selected by the switches SW1 and SW2 and the resonators Re22 are selected by the switches SW3 and SW4 when the variable filter circuit 10A is controlled such that only the channel CH4 is set as the pass band thereof, similarly to as in the case where the channel CH3 is set as the pass band. The pass band of the variable filter circuit 10A is made to match the channel CH4 by adjusting the variable capacitors Cc1 and Cc2 and the variable capacitors Cc3 and Cc4.

Figure 6B:
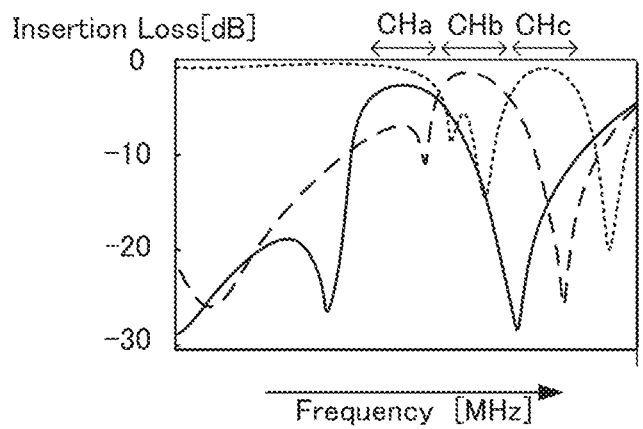

FIG. 6B illustrates an example of changes that occur in the bandpass characteristic of the variable filter circuit 10A with switching of the switches SW1, SW2, SW3 and SW4. Here, the pass band of the variable filter circuit is changed to match three adjacent channels by switching the switches SW1, SW2, SW3 and SW4 and adjusting the variable capacitors Cc1, Cc2, Cc3 and Cc4. In FIG. 6B, the solid line is made to match a channel CHa that is at a comparatively low frequency, the chain line is made to match a channel CHb that is adjacent to the high-frequency side of the channel CHa, and the dotted line is made to match a channel CHc that is adjacent to the high-frequency side of the channel CHb.

In all of the cases, steep attenuation characteristics can be obtained in adjacent channels while making the pass band of the variable filter circuit 10A match a desired channel by switching the switches SW1, SW2, SW3 and SW4 and adjusting the variable capacitors Cc1, Cc2, Cc3 and Cc4.

By adopting a configuration in which connections to a plurality of resonators can be switched as in the variable filter circuit according to this embodiment described above, the pass band can be precisely adjusted over a wide bandwidth by switching the switches and adjusting the variable capacitors. In addition, steep attenuation characteristics can be obtained in a band close to the high-frequency side of the pass band and in a band close to the low-frequency side of the pass band. In addition, although a case has been described in this embodiment in which the pass band is adjusted over a wide bandwidth by switching switches and the bandwidth and the center frequency of the pass band are precisely set by adjusting variable capacitors, a configuration may instead be adopted in which, conversely, the pass band is adjusted over a wide bandwidth by adjusting variable capacitors and the bandwidth and center frequency of the pass band are precisely set by switching switches.

<<Third Embodiment>>

Figure 7:
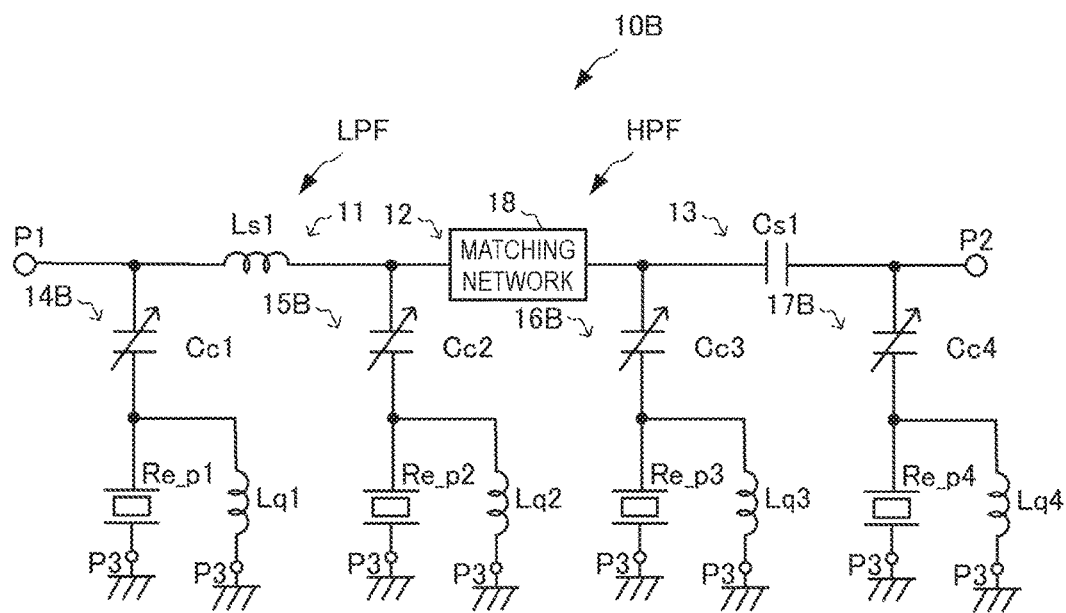
FIG. 7 is a circuit diagram of a variable filter circuit according to a third embodiment.

FIG. 7 is a circuit diagram that illustrates a variable filter circuit 10B according to a third embodiment of the present disclosure.

The variable filter circuit 10B includes ports P1, P2 and P3, series arms 11, 12 and 13 and parallel arms 14B, 15B, 16B and 17B.

The parallel arm 14B includes a variable capacitor Cc1, a resonator Re_p1 and an inductor Lq1. One end of the inductor Lq1 is connected to a connection point between the variable capacitor Cc1 and the resonator Re_p1, and the other end of the inductor Lq1 is connected to a port P3. The parallel arm 15B includes a variable capacitor Cc2, a resonator Re_p2 and an inductor Lq2. One end of the inductor Lq2 is connected to a connection point between the variable capacitor Cc2 and the resonator Re_p2, and the other end of the inductor Lq2 is connected to a port P3. The parallel arm 16B includes a variable capacitor Cc3, a resonator Re_p3 and an inductor Lq3. One end of the inductor Lq3 is connected to a connection point between the variable capacitor Cc3 and the resonator Re_p3, and the other end of the inductor Lq3 is connected to a port P3. The parallel arm 17B includes a variable capacitor Cc4, a resonator Re_p4 and an inductor Lq4. One end of the inductor Lq4 is connected to a connection point between the variable capacitor Cc4 and the resonator Re_p4 and the resonator Re_p4 and the other end of the inductor Lq4 is connected to a port P3.

The inductors Lq1, Lq2, Lq3 and Lq4 have similar functions to the inductors Lp1, Lp2, Lp3 and Lp4 described in the first embodiment.

Figure 8:
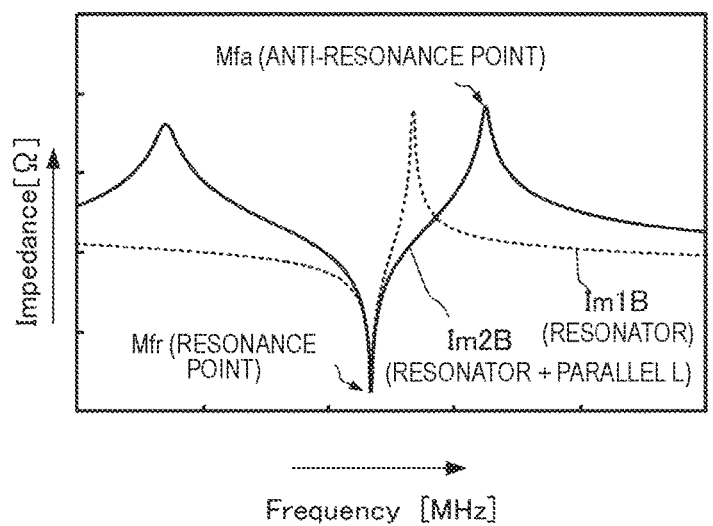
FIG. 8 is a characteristics diagram for explaining the function of reactance elements of parallel arms according to the third embodiment.

FIG. 8 illustrates impedance characteristics in a circuit in which the inductor Lq1 and the resonator Re_p1 are connected to each other. The dotted line in FIG. 8 represents an impedance characteristic Im1B of just the resonator Re_p1. In addition, the solid line in FIG. 8 represents an impedance characteristic Im2B in a circuit in which the inductor Lq1 and the resonator Re_p1 are connected to each other.

Comparing the impedance characteristic Im2B of the resonator Re_p1 in the case where the inductor Lq1 is provided and the impedance characteristic Im1B of the resonator Re_p1 in the case where the inductor Lq1 is omitted illustrated in FIG. 8, although the resonance points Mfr are the same, the anti-resonance point Mfa of the impedance characteristic Im2B is shifted toward the high-frequency side compared with the anti-resonance point Mfa of the impedance characteristic Im1B.

Thus, the inductor Lq1 has a function of widening the frequency interval between the resonance point Mfr and the anti-resonance point Mfa by causing the anti-resonance point Mfa of the resonator Re_p1 to shift toward the high-frequency side in the impedance characteristic. Similarly, the inductors Lq2, Lq3 and Lq4 have functions of widening the frequency interval between the resonance point Mfr and the anti-resonance point Mfa by causing the anti-resonance points Mfa of the resonators Re_p2, Re_p3 and Re_p4 to shift toward the high-frequency side in the impedance characteristics. Therefore, the variable range of the cutoff frequencies of the pass band, which can be controlled by adjusting the variable capacitors Cc1, Cc2, Cc3 and Cc4, can also be widened by widening the band between the resonance point Mfr and the anti-resonance point Mfa by connecting the inductors Lq1, Lq2, Lq3 and Lq4 in parallel with the resonators Re_p1, Re_p2, Re_p3 and Re_p4.

<<Fourth Embodiment>>

Figure 9:
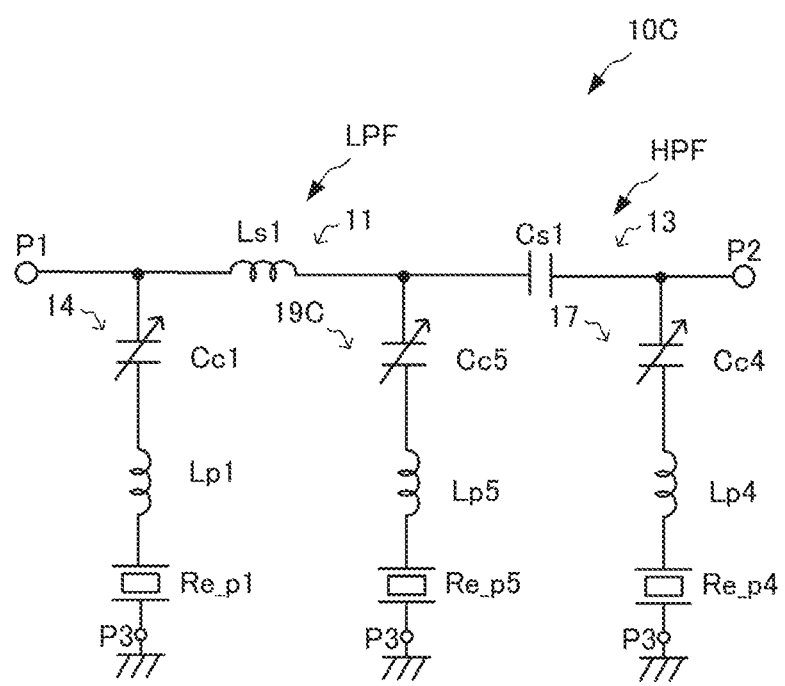
FIG. 9 is a circuit diagram of a variable filter circuit according to a fourth embodiment.

FIG. 9 is a circuit diagram that illustrates a variable filter circuit 10C according to a fourth embodiment of the present disclosure.

The variable filter circuit 10C has a configuration obtained by omitting the matching network from the circuit configuration according to the first embodiment and employing a shared parallel arm as the parallel arm on the side of the first π circuit LPF that is connected to the second π circuit HPF and the parallel arm on the side of the second π circuit HPF that is connected to the first π circuit LPF.

That is, the variable filter circuit 10C includes ports P1, P2 and P3, series arms 11 and 13, and parallel arms 14, 17 and 19C. The parallel arm 19C includes a variable capacitor Cc5, a resonator Re_p5 and an inductor Lq5. In this configuration, the number of resonators and variable capacitors can be reduced by utilizing a shared parallel arm, and therefore, an increase in the overall size of the variable filter circuit 10C and an increase in the complexity of controlling the variable capacitors can be further suppressed.

<<Modifications>>

Figure 10A:
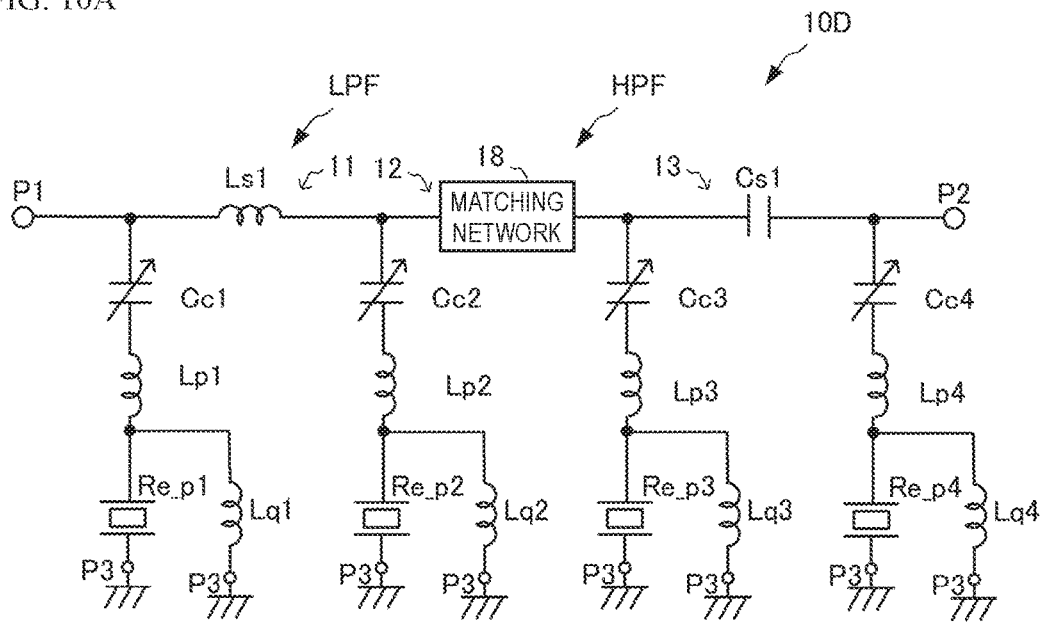
FIGS. 10A and 10B are circuit diagrams of a variable filter circuit according to a modification.

FIG. 10A is a circuit diagram illustrating a variable filter circuit 10D according to a first modification of the present disclosure.

Inductors Lp1, Lp2, Lp3 and Lp4, which are connected in series with resonators Re_p1, Re_p2, Re_p3 and Re_p4, and inductors Lq1, Lq2, Lq3 and Lq4, which are connected in parallel with the resonators Re_p1, Re_p2, Re_p3 and Re_p4, are provided in parallel arms of the variable filter circuit 10D.

As described above, the inductors Lp1, Lp2, Lp3 and Lp4 have functions of shifting the resonance points Mfr of the resonators Re_p1, Re_p2, Re_p3 and Re_p4 toward the low-frequency side in the impedance characteristic. In addition, the inductor Lq1, Lq2, Lq3 and Lq4 have functions of shifting the anti-resonance points Mfa of the resonators Re_p1, Re_p2, Re_p3 and Re_p4 toward the high-frequency side in the impedance characteristic. Therefore, as a result of providing the inductors Lp1, Lp2, Lp3 and Lp4 and the inductors Lq1, Lq2, Lq3 and Lq4, the band between the resonance point Mfr and the anti-resonance point Mfa in the impedance characteristic can be further widened and the variable range of the cutoff frequencies on the high-frequency side and the low-frequency side of the pass band, which are adjusted by adjusting the variable capacitors Cc1, Cc2, Cc3 and Cc4, can be further widened.

Figure 10B:
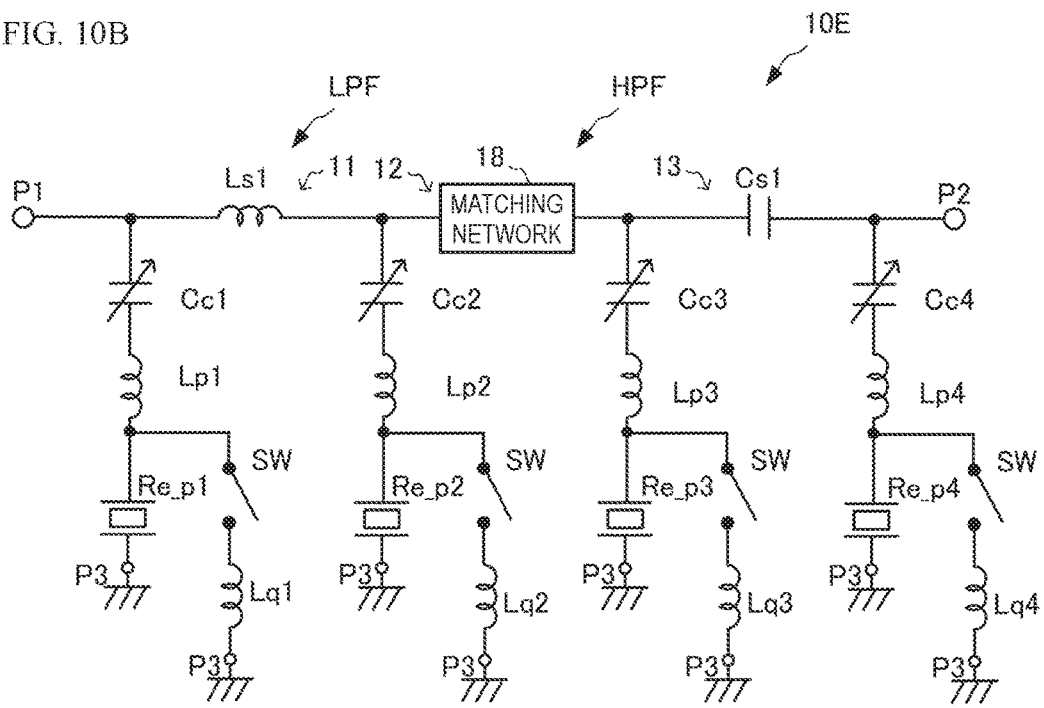

FIG. 10B is a circuit diagram illustrating a variable filter circuit 10E according to a second modification of the present disclosure.

Inductors Lp1, Lp2, Lp3 and Lp4, which are connected in series with resonators Re_p1, Re_p2, Re_p3 and Re_p4, inductors Lq1, Lq2, Lq3 and Lq4, which are connected in parallel with the resonators Re_p1, Re_p2, Re_p3 and Re_p4, and switches SW, which turn the connection states of the parallel-connected inductors Lq1, Lq2, Lq3 and Lq4 on or off, are provided in parallel arms of the variable filter circuit 10E. The switches SW correspond to a connection switching unit described in the Claims. In addition, in this case, the inductors Lq1, Lq2, Lq3 and Lq4 correspond to a reactance unit described in the Claims.

By providing the switches SW in this way, it is possible to change the frequency characteristics of the variable filter circuit 10E by controlling the switches SW, and the degree of freedom with which the filter characteristics can be set by the variable filter circuit 10E is improved. Although an example been described here in which inductors are employed as circuit elements whose connections are switched by controlling the switches SW, circuit elements other than inductors such as capacitors may instead be provided and the connections of these circuit elements may be switched by controlling the switches SW.

<<Fifth Embodiment>>

Figure 11:
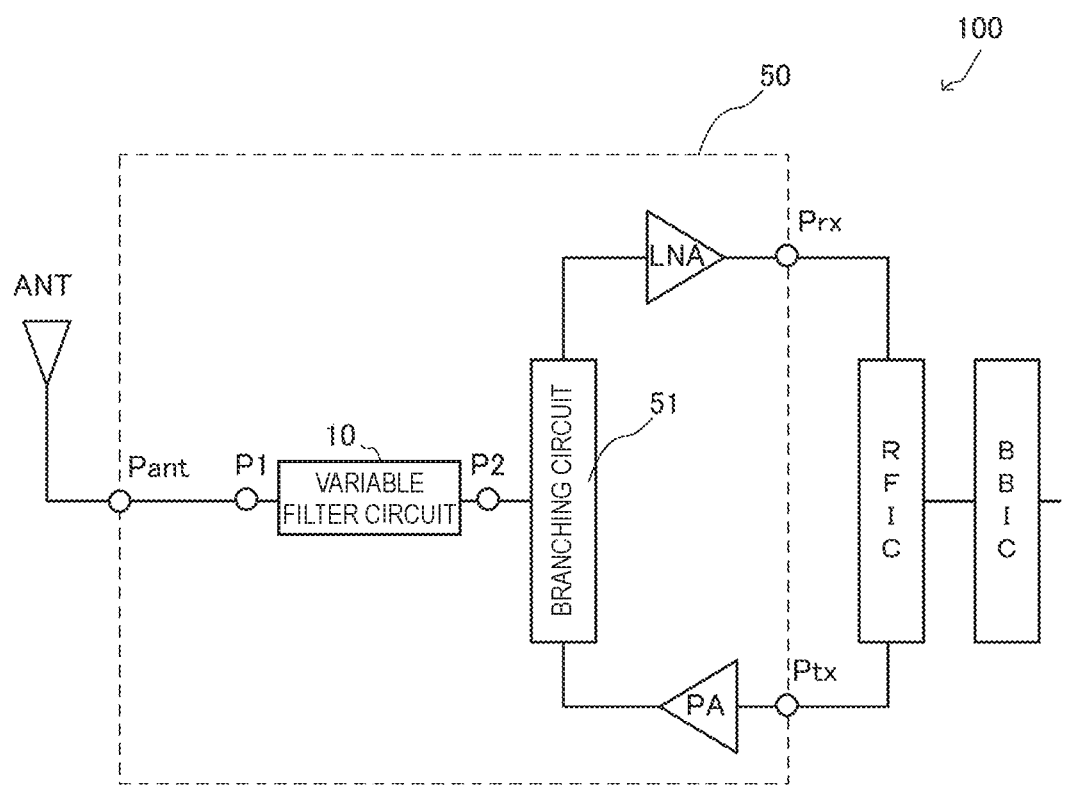
FIG. 11 is a circuit diagram of a communication device and an RF front end circuit according to a fifth embodiment.

FIG. 11 is a circuit diagram illustrating a communication device 100 and an RF front end circuit 50 according to a fifth embodiment of the present disclosure.

The communication device 100 includes an antenna ANT, an RF front end circuit 50, a high-frequency circuit RFIC and a baseband circuit BBIC. Here, the antenna ANT is used for both transmission and reception, and is connected to an antenna connection terminal Pant of the RF front end circuit 50. The high-frequency circuit RFIC is connected to a transmission signal terminal (signal processing circuit connection terminal) Ptx and a reception signal terminal (signal processing circuit connection terminal) Prx of the RF front end circuit 50, generates a transmission signal and outputs the generated transmission signal to the RF front end circuit 50, and demodulates a reception signal input from the RF front end circuit 50. The baseband circuit BBIC is connected to the RF front end circuit 50 via the high-frequency circuit RFIC and processes a baseband signal. The high-frequency circuit RFIC and the baseband circuit BBIC correspond to a signal processing circuit in this embodiment.

The RF front end circuit 50 includes the variable filter circuit 10 described in the first embodiment, a branching circuit 51, a low-noise amplifier LNA and a power amplifier PA. Here, the variable filter circuit 10 is employed as an antenna tuner and has a function of selecting the communication band of a transmission/reception signal (communication channel). The variable filter circuit according to any of the second to fourth embodiments may be employed instead of the variable filter circuit 10 according to the first embodiment.

The branching circuit 51 is a single or composite circuit made up of a duplexer, a diplexer, a circulator, a switchplexer or the like, and has a function of branching a transmission signal and a reception signal in order to prevent a reception signal from affecting the transmission signal terminal Ptx side of the circuit and to prevent a transmission signal from affecting the reception signal terminal Prx side of the circuit. The low-noise amplifier LNA has a function of amplifying a reception signal. The power amplifier PA has a function of amplifying a transmission signal.

The communication device 100 and the RF front end circuit 50 of the present disclosure can be configured in this way. The variable filter circuit 10 of the present disclosure can control the bandwidth and the cutoff frequencies of a pass band, and is suitably applied to a communication system in which there are a plurality of adjacent communication bands (communication channels) and the variable filter circuit 10 is used to switch between the communication channels in order to realize a high attenuation and steepness at frequencies close to the low-frequency side and/or the high-frequency side of the pass band.

The present disclosure can be carried out as described in the above embodiments and modifications. The present disclosure can also be carried out with any other configuration not described in the above embodiments and modifications so long as the configuration falls within the scope of the Claims. A configuration in which connections to a plurality of resonators are switched as described in the second embodiment may be applied to the circuit configurations described in the third embodiment and the first and second modifications.

REFERENCE SIGNS LIST

Re_p1, Re_p2, Re_p3, Re_p4, Re_p5 . . . resonator
Cc1, Cc2, Cc3, Cc4, Cc5 . . . variable capacitor
Cs1 . . . capacitor
Ls1, Lp1, Lp2, Lp3, Lp4, Lp5, Lq1, Lq2, Lq3, Lq4 . . . inductor
LPF, HPF . . . π circuit
10, 10A, 10B, 10C, 10D, 10E . . . variable filter circuit
11, 12, 13 . . . series arm
14, 15, 16, 17, 14A, 15A, 16A, 17A, 14B, 15B, 16B, 17B, 19C . . . parallel arm
18 . . . matching network
50 . . . RF front end circuit
100 . . . communication device

The invention claimed is:

1. A variable filter circuit serving as a band pass filter formed from a high pass filter and a low pass filter, the variable filter circuit comprising:
   a plurality of reactance elements that are connected in series between a first terminal and a second terminal; and
   a plurality of parallel arms, wherein each one of the plurality of parallel arms is connected between an end of at least one of the plurality of reactance elements and a ground terminal and comprises:
      a resonance circuit; and
      a variable reactance connected in series with the resonance circuit,
   wherein the plurality of reactance elements includes a capacitor having a capacitive reactance in a first frequency band and an inductor having an inductive reactance in a second frequency band,
   wherein the high pass filter is a π circuit comprising the capacitor of the plurality of reactance elements and at least two of the plurality of parallel arms being connected to both ends of the capacitor of the plurality of reactance elements,
   wherein the low pass filter is a π circuit comprising the inductor of the plurality of reactance elements and at least two of the plurality of parallel arms being connected to both ends of the inductor of the plurality of reactance elements, and wherein an attenuation pole frequency of the high pass filter is lower than an attenuation pole frequency of the low pass filter.

2. The variable filter circuit according to claim 1, wherein each of the parallel arms further comprises:
an inductor connected in series with the resonance circuit.

3. The variable filter circuit according to claim 2, wherein each of the parallel arms further comprises:
a reactance circuit having a reactance element connected in parallel with the resonance circuit.

4. The variable filter circuit according to claim 3, wherein the reactance circuit connected in parallel with the resonance circuit is connected at a first end between the resonance circuit and the inductor connected in series with the resonance circuit, and at a second end to the ground terminal.

5. The variable filter circuit according to claim 3, wherein the reactance circuit further comprises:
a switch that selectively connects the reactance element to be connected in parallel with the resonance circuit.

6. The variable filter circuit according to claim 1, wherein each resonance circuit includes a plurality of resonators and a switch that selects and connects one of the plurality of resonators.

7. The variable filter circuit according to claim 1, further comprising:
a matching network that is connected between the inductor and the capacitor of the plurality of reactance elements.

8. The variable filter circuit according to claim 1, wherein each of the parallel arms further comprises:
a reactance circuit connected in parallel with the resonance circuit.

9. The variable filter circuit according to claim 1, comprising first, second, and third parallel arms,
wherein the first parallel arm is connected at a first end between the first terminal and the inductor of the plurality of reactance elements, and at a second end to the ground terminal,
wherein the second parallel arm is connected at a first end between the inductor of the plurality of reactance elements and the capacitor of the plurality of reactance elements, and at a second end to the ground terminal,
wherein the third parallel arm is connected at a first end between the second terminal and the capacitor of the plurality of reactance elements, and at a second end to the ground terminal.

10. An RF front end circuit comprising:
the variable filter circuit according to claim 1;
an antenna connection terminal that is provided on a first end of the variable filter circuit; and
a signal processing circuit connection terminal that is provided on a second end of the variable filter circuit.

11. A communication device comprising:
the RF front end circuit according to claim 10;
an antenna that is connected to the antenna connection terminal; and
a signal processing circuit that is connected to the signal processing circuit connection terminal.

* * * * *